(12) United States Patent
Donolo et al.

(10) Patent No.: US 11,754,602 B2
(45) Date of Patent: Sep. 12, 2023

(54) FREQUENCY SENSING SYSTEMS AND METHODS

(71) Applicant: Schweitzer Engineering Laboratories, Inc., Pullman, WA (US)

(72) Inventors: Marcos A. Donolo, Pullman, WA (US); Jay Hartshorn, Moscow, ID (US)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 50 days.

(21) Appl. No.: 17/545,385

(22) Filed: Dec. 8, 2021

(65) Prior Publication Data

US 2022/0099717 A1    Mar. 31, 2022

Related U.S. Application Data

(63) Continuation of application No. 16/569,702, filed on Sep. 13, 2019, now Pat. No. 11,231,449.

(60) Provisional application No. 62/734,900, filed on Sep. 21, 2018.

(51) Int. Cl.
*G01R 23/02* (2006.01)
*G01R 23/00* (2006.01)
*H03M 1/12* (2006.01)

(52) U.S. Cl.
CPC ........... *G01R 23/02* (2013.01); *G01R 23/005* (2013.01); *H03M 1/12* (2013.01)

(58) Field of Classification Search
CPC .. G01R 19/2513; G01R 31/08; G01R 31/081; G01R 31/083; G01R 31/085; G01R 31/088; G01R 31/10; G01R 31/11; G01R 31/50; G01R 31/58; H02H 3/28; H02H 7/261; H02H 7/263; H02H 7/265; H04B 3/46; H04B 3/50; H04B 3/54
See application file for complete search history.

(56) References Cited

U.S. PATENT DOCUMENTS

| | | | |
|---|---|---|---|
| 2016/0181966 A1* | 6/2016 | Donolo | H02H 7/0805 318/434 |
| 2017/0146577 A1* | 5/2017 | Kasztenny | H01H 47/00 |
| 2018/0364290 A1* | 12/2018 | Xia | H02H 3/283 |

* cited by examiner

*Primary Examiner* — Feba Pothen
*Assistant Examiner* — Brent J Andrews
(74) *Attorney, Agent, or Firm* — Fletcher Yoder, P.C.

(57) ABSTRACT

Systems and methods may be used to measure a frequency of a power delivery system and/or of a supply signal transmitted to a load. A system may record an input waveform, determine a frequency of the input waveform at a present time based at least in part on the input waveform and a derivative of the input waveform, and control an operation of a power delivery system based at least in part on the determined frequency.

20 Claims, 11 Drawing Sheets

FREQUENCY SENSING SYSTEMS AND METHODS

CROSS-REFERENCE TO RELATED APPLICATIONS

This present application claims priority as a continuation of U.S. patent application Ser. No. 16/569,702, filed on Sep. 13, 2019, titled "Frequency Sensing Systems and Methods," which claims priority to U.S. Provisional Patent Application No. 62/734,900, filed on Sep. 21, 2018 and entitled "Electric Power Delivery System Frequency Measurement," both of which are incorporated herein by reference in their entireties.

BACKGROUND

This disclosure relates to sensing operations in a power delivery system. More particularly, this disclosure relates to frequency sensing operations of an electrical waveform based at least in part on a derivative calculation of the electrical waveform.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of any kind.

Electric power delivery systems are widely used to generate and distribute electric power to loads. While some systems (or portions of systems) operate in direct current (DC), many electric power delivery systems operate (or have portions that operate) in alternating current (AC). In AC systems, the power flowing through the conductors and other power system equipment is from current waveforms and voltage waveforms alternating between high and low peaks generally in a sinusoidal fashion. The frequency of the alternating waveforms are a valuable power system measurement for system control and protection, and for many other monitoring and protection functions. For example, frequency measurement operations, load shedding operations, overexcitation protection operations, synchrophasor measurement operations, switching operations, bus transfer operations, and so on may each use a measured frequency during operations. Some measurements of power system frequency, however, may be inefficient and/or take a complete period of the power system frequency to determine.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
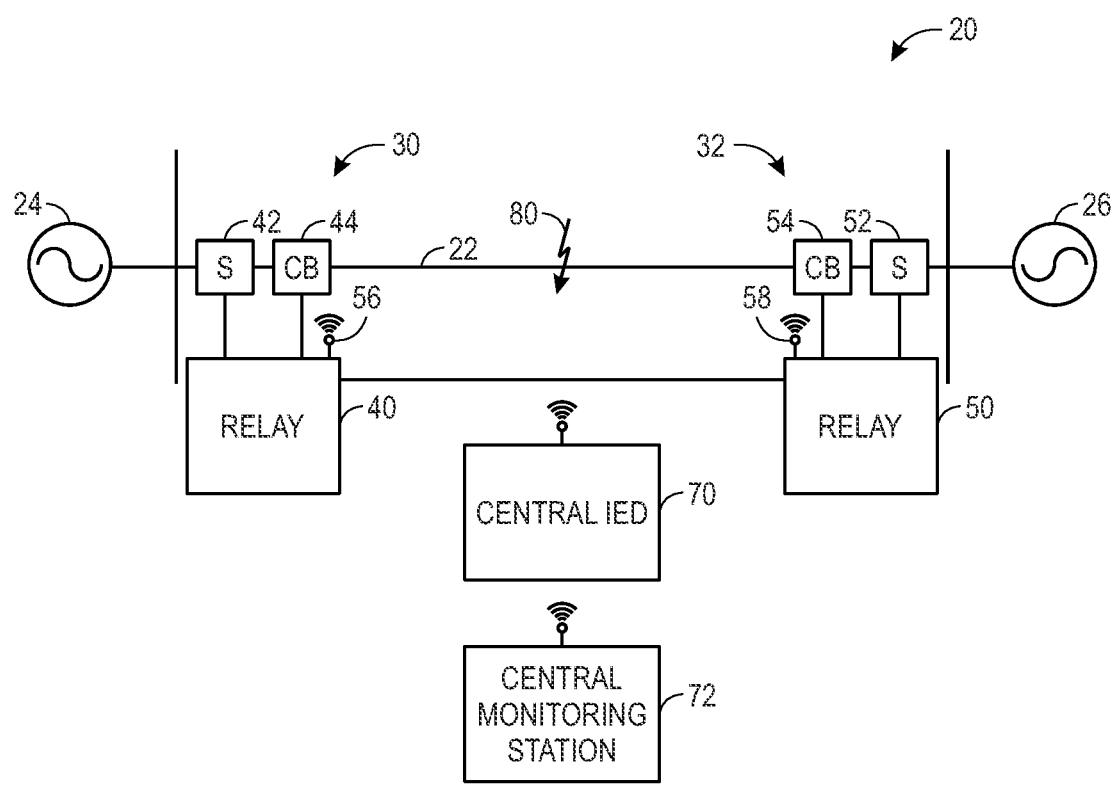
FIG. 1 illustrates a block diagram of an embodiment of a power delivery (e.g., transmission) system, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Certain examples commensurate in scope with the originally claimed subject matter are discussed below. These examples are not intended to limit the scope of the disclosure. Indeed, the present disclosure may encompass a variety of forms that may be similar to or different from the examples set forth below.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

Electric power delivery systems may generate and distribute electric power to loads. In some electric power delivery systems, at least a portion of the electric power delivery system operates in direct current (DC). However, many electric power delivery systems operate at least partially in alternating current (AC). In AC systems, operations of the electric power delivery system are sometimes based on a frequency of the waveforms generated and/or distributed via the electric power delivery system. These operations may include, for example, frequency control operations, frequency protection operations, load shedding operations, overexcitation protection operations, synchrophasor measurement operations, switching operations, bus transfer operations, or the like. Accordingly, accurate measurement of power system frequency may be useful for proper monitoring and protection of the power system.

Since voltage waveforms and/or current waveforms of the electric power delivery system are periodic, frequency may be measured using the period of the waveform. For example, a frequency may be determined by measuring a time between consecutive high peaks, a time between consecutive low peaks, a time between rising zero crossings, a time between falling zero crossings, or the like. However, such frequency calculations may use a complete power system cycle. In many applications, it may be desirable to calculate frequency in less than a power system cycle. Indeed, although ideal waveforms are periodic in steady state, power system frequencies may fluctuate. In a functioning power system, voltage waveforms and/or current waveforms are not precisely periodic, and the frequency may vary within periods. Thus, a system able to determine power system frequency in less than a complete power system cycle using the available waveforms such as current, voltage, and the like, may be desired.

As described below, a system may use a waveform (e.g., voltage, current) and a derivative of the waveform to determine a frequency of the waveform in less than a complete power system cycle. By using the systems and methods described herein, a frequency determination may be more efficient, and thus may improve a speed of frequency determination, as well as the speed of subsequent control operations that use the determined frequency.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, or the like, that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein.

The non-transitory computer-readable medium may include, but is not limited to, hard drives, floppy diskettes, optical disks, compact disc read-only memories (CD-ROMs), digital versatile disc read-only memories (DVD-ROMs), read-only memories (ROMs), random access memories (RAMs), erasable programmable read-only memories (EPROMs), electrically erasable programmable read-only memories (EEPROMs), magnetic or optical cards, solid-state memory devices, or other types of machine-readable media suitable for storing electronic and/or processor executable instructions.

FIG. 1 illustrates a block diagram of a power delivery system 20 (e.g., electrical power transmission system). The power delivery system 20 may be any suitable power delivery system 20, such as a three-phase power delivery system. Moreover, although the one-line block diagram is used as a simplified example, the systems and methods disclosed herein may be used in conjunction with any suitable electric power delivery system, such as a power transmission system, a power distribution system, radial power distribution systems, bi-directional power systems, or the like. The power delivery system 20 may generate, transmit, and distribute electric energy to loads. The power delivery system 20 may include various types of equipment, such as electric generators, power transformers, power transmission and/or delivery lines, circuit breakers, busses, loads, and the like. A variety of other types of equipment may also be included in power delivery system 20, such as voltage regulators, capacitor banks, and the like. Furthermore, the system and methods disclosed herein may additionally or alternatively be used with loads as well, such as to determine a frequency of a voltage supplied to a load without considering a frequency of the system as a whole. In the illustrated example, the power delivery system 20 includes a power line 22 that transfers electrical energy from a first power generator 24 (e.g., local power generator) and a second power generator 26 (e.g., remote power generator) to one or more loads.

The power delivery system 20 may be monitored, controlled, automated, and/or protected using protection systems 30 and 32. The protection systems 30 and 32 may each include one or more intelligent electronic devices (IEDs), such as a local relay 40 and a remote relay 50. For example, the IEDs may be used to monitor equipment of many types, including electric transmission lines, electric distribution lines, current transformers, busses, switches, circuit breakers, reclosers, transformers, autotransformers, tap changers, voltage regulators, capacitor banks, generators, motors, pumps, compressors, valves, and a variety of other types of monitored equipment. Note that, as used herein, the local relay 40 may refer to the relay that is determining the location of the fault at a distance from that relay. Further, the remote relay 50 may refer to the relay that transmits data (e.g., current measurements and voltage measurements) to be used by the local relay 40 in determining the location of the fault. The remote relay 50 may be any suitable distance from the local relay 40.

As used herein, an IED (such as the local relay 40 and the remote relay 50) may refer to any microprocessor-based device that monitors, controls, automates, and/or protects monitored equipment within the power delivery system 20. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system that includes multiple IEDs.

A common time signal may be distributed throughout the power delivery system 20. Utilizing a common or universal time source may enable the IEDs to generate time synchronized data. In various embodiments, relays 40 and 50 may receive the common time signal. The common time signal may be distributed in the power delivery system 20 using a communications network or using a common time source, such as a Global Navigation Satellite System ("GNSS"), or the like.

According to various embodiments, the local relay 40 and the remote relay 50 may use communication circuitry 56 and 58 to communicate with each other, with one or more other IEDs 70, and/or with a central monitoring station 72. In some embodiments, the local relay 40 and the remote relay 50 may communicate with the IED 70 and/or the central monitoring station 72 directly or via a communication network. The central monitoring station 72 may include one or more of a variety of types of systems. For example, central monitoring station 72 may include a supervisory control and data acquisition (SCADA) system and/or a wide area control and situational awareness (WACSA) system. The local relay 40 and the remote relay 50 may communicate over various media such as direct communication or over a wide-area communications network.

Network communication may be facilitated by networking devices including, but not limited to, multiplexers, access points, routers, hubs, gateways, firewalls, and switches. In some embodiments, IEDs and network devices may include physically distinct devices. In other embodiments, IEDs and network devices may be composite devices, or may be configured in a variety of ways to perform overlapping functions IEDs and network devices may include multi-function hardware (e.g., processors, computer-readable storage media, communications interfaces, etc.) that may be utilized to perform a variety of tasks that pertain to network communications and/or to operation of equipment within the power delivery system 20.

As explained below, the local relay 40 and/or the remote relay 50 may monitor the electrical characteristics of power on the power line 22 via sensor circuitry 42 and 52. Each of the local relay 40 and the remote relay 50 may be communicatively coupled to a respective circuit breaker 44 and 54. Upon occurrence of a fault 80, the local relay 40, the remote relay 50, the other IED 70, and/or the central monitoring station 72, may effect a control operation on the power delivery system 20, such as opening the local circuit breaker 44 or opening the remote circuit breaker 54.

Figure 2:
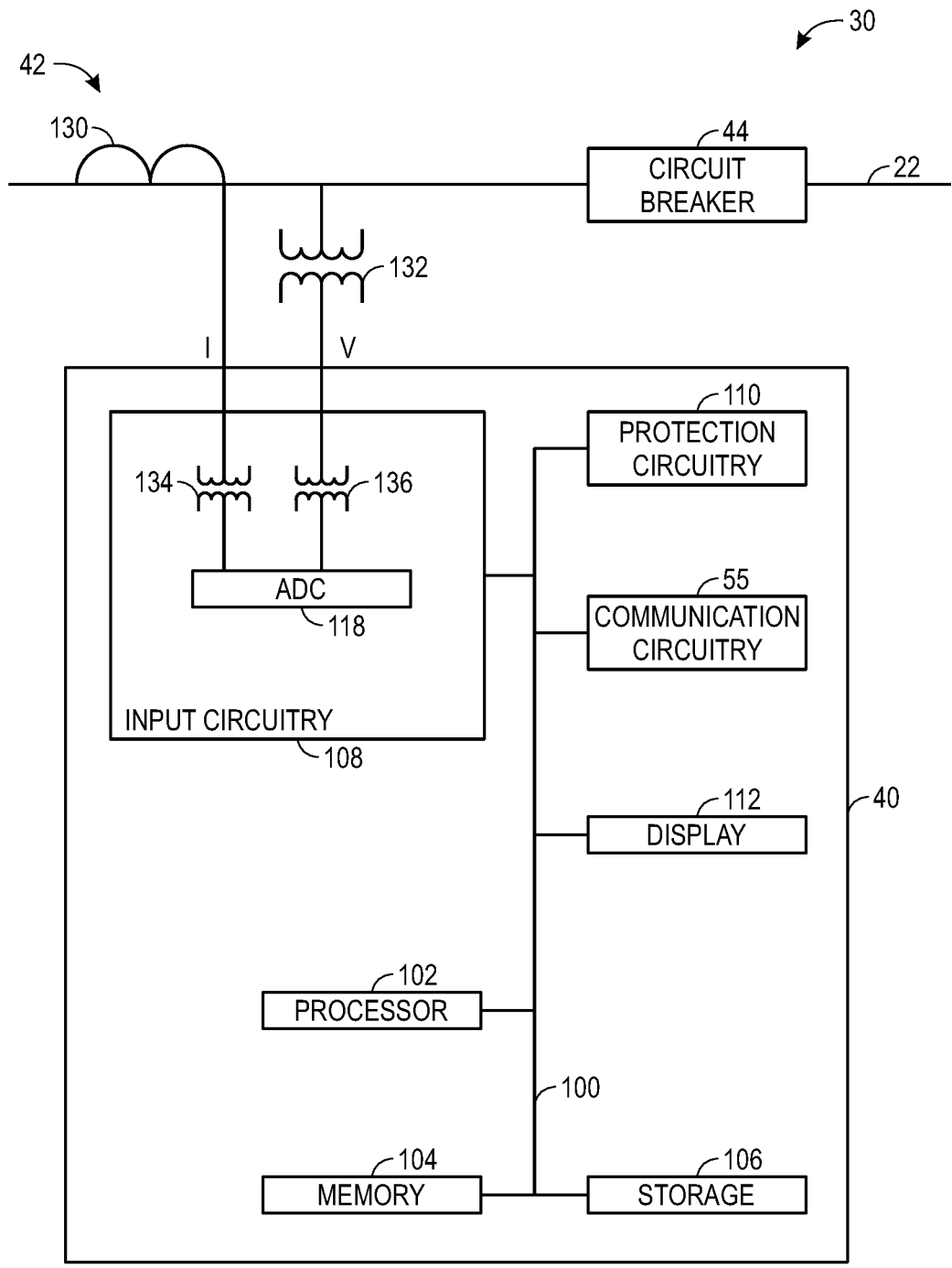
FIG. 2 illustrates a block diagram of a protection system of the power delivery system of FIG. 1, in accordance with an embodiment.

FIG. 2 illustrates a block diagram of the protection system 30 that may be used to determine a location of a fault, determine a frequency of a voltage, effect a control operation on the power delivery system 20, or the like. In the illustrated embodiment, the protection system 30 includes the local relay 40, the sensor circuitry 42, and the local circuit breaker 44. The local relay 40 may include a bus 100 connecting a processor 102 or processing unit(s) to a memory 104, a computer-readable storage medium 106, input circuitry 108, protection circuitry 110, and one or more displays 112. In some embodiments, the processor 102 may include two or more processors. The computer-readable storage medium 106 may include and/or interface with software, hardware, and/or firmware modules for implementing various portions of the systems and methods described herein. The computer-readable storage medium 106 may be the repository of one or more modules and/or executable instructions to implement any of the processes described herein. In some embodiments, the computer-readable storage medium 106 and the modules therein may all be implemented as hardware components, such as via discrete electrical components, via a Field Programmable Gate Array ("FPGA"), and/or via one or more Application Specific Integrated Circuits ("ASICs").

The processor 102 may process inputs received via the input circuitry 108 and/or the communication circuitry 56. The processor 102 may operate using any number of processing rates and architectures. The processor 102 may perform various algorithms and calculations described herein using computer-executable instructions stored on computer-readable storage medium 106. In some embodiments, the processor 102 may be embodied as a microprocessor, a general purpose integrated circuit, an ASIC, a FPGA, and/or other programmable logic devices.

The sensor circuitry 42 may include a current transformer 130 and/or a potential (e.g., voltage) transformer 132. The input circuitry 108 may receive electric current waveforms and/or voltage waveforms from the current transformer 130 and the potential transformer 132 respectively, transform the signals using respective potential transformer(s) 134 and 136 to a level that may be sampled, and sample the signals using, for example, analog-to-digital (A/D) converter(s) 118 to produce digital signals representative of measured current and measured voltage on the power line. Similar values may also be received from other distributed controllers, station controllers, regional controllers, or centralized controllers. The values may be in a digital format or other format. In certain embodiments, the input circuitry 108 may be utilized to monitor current signals associated with a portion of a power delivery system 20. Further, the input circuitry 108 may monitor a wide range of characteristics associated with monitored equipment, including equipment status, temperature, frequency, pressure, density, infrared absorption, radio-frequency information, partial pressures, viscosity, speed, rotational velocity, mass, switch status, valve status, circuit breaker status, tap status, meter readings, conductor sag, and the like.

The A/D converter 118 may be connected to the processor 102 by way of the bus 100, through which digitized representations of current and voltage waveforms may be transmitted to the processor 102. As described above, the processor 102 may be used to monitor and/or protect portions of the power delivery system 20, and issue control instructions in response to the same (e.g., instructions implementing protective actions). For example, the processor 102 may determine a location of a fault on a power line 22 based on the digitized representations of the current and/or voltage waveforms.

In response to detecting a fault or otherwise abnormal behavior, the processor 102 may toggle a control operation on the power delivery system 20 via the protection circuitry 110. For example, the processor 102 may send a signal to control operation of the local circuit breaker 44, such as to disconnect the power line 22 from the local power generator 24. As illustrated, the local relay 40 may include the display 112 to display alarms indicating the location of the fault to an operator. The communication circuitry 56 may include a transceiver to communicate with one or more other IEDs and/or a central monitoring station, or the like. In some embodiments, the processor 102 may cause the transceiver to send a signal indicating the location of the fault. For example, the processor 102 may send, via the transceiver of the communication circuitry 56, a signal indicating the location of the fault to the central monitoring station 72. Further, the processor 102 may activate the alarms upon detection of the fault.

Figure 3:
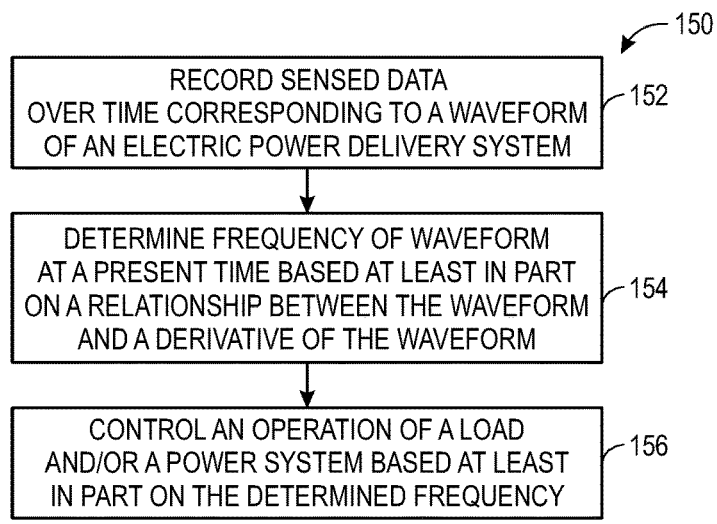
FIG. 3 is a flow diagram of a process for controlling the power delivery system of FIG. 1 and/or the protection system of FIG. 2 based at least in part on a determined frequency of a waveform (e.g., voltage waveform, current waveform), in accordance with an embodiment.

FIG. 3 is a flow diagram of a process 150 for operating the power delivery system 20, the protection circuitry 110, loads, or the like based at least in part on a determined frequency of a waveform (e.g., voltage, current). The relay 40 may perform the process 150 (e.g., frequency determination operations) using, for example, the processor 102. However, it should be understood that, although the relay 40 may perform the determination locally, the relay 40 may transmit the determined frequency through a communication network to other control circuitry. For example, the frequency may be sent to a supervisory control and data acquisition (SCADA) system for use in additional or different control operations. The frequency may be determined via computations involving signal derivatives. The process 150 is described below as being performed by the processor 102; however, it should be understood that any suitable processor or processing circuitry may perform the process 150 to perform a frequency sensing operation. Furthermore, although depicted in a particular order, it should be understood that any suitable order, and fewer or additional operations, may be performed when performing the process 150. Additionally, the process 150 is described below as based on recorded voltage data corresponding to a voltage waveform of the power delivery system 20. It is noted that in some cases recorded current data may be used to determine the frequency.

For the example of a voltage waveform, at block 152, the processor 102 may record sensed voltage data over time. The processor 102 may be communicative coupled to sensing circuitry, such as the potential transformer 132 or the current transformer 130. Sensing data may be received by the processor 102 via the input circuitry 108, the communication circuitry 56, or the like. The sensing data may indicate to the processor 102 a voltage at a time of sensing. The processor 102 may receive the sensing data and store the sensing data in memory 104, such as to generate a historic sensing data record. The sensing data may also be stored with a timestamp defining the time of sensing of the data. The timestamp may be assigned to the sensing data based at least in part on a time received from a common time source.

At block 154, the processor 102 may determine a frequency of the voltage waveform sensed at a present time (e.g., most recent time). The derivative of the voltage waveform may be computed numerically from the sensing data samples recorded over time. Operations performed by the processor 102 to compute the derivative of the voltage waveform and the frequency of the voltage waveform are further explained via a method depicted in FIG. 5. Generally, the operations enable the processor 102 to compare a present value of the voltage waveform (e.g., a presently sensed voltage value, sensing data) with one or more previous values of the derivatives of the voltage waveform to determine when the derivative of the voltage waveform equals the present value of the voltage waveform, thus identifying the frequency of the voltage waveform. In some embodiments, this comparison is a discrete comparison, where distinctly sensed voltage values are recorded and compared over time. Furthermore, the processor 102 may perform a discrete derivative determination on the sensed data of the voltage waveform, where each sensed data received by the processor 102 may be associated with a respectively determined derivative value. In this way, in some cases, the sensed voltage values may not be curve-fitted into a sinusoidal waveform or other definition, and the comparison is performed on the discretely-obtained sensed voltage values.

At block 156, the processor 102 may control an operation of a load and/or a power system based at least in part on the determined frequency. In this way, the processor 102 may be a part of a control loop that responds in real-time to operating condition changes. For example, if the determined frequency of the voltage exceeds a threshold, the processor 102 may generate control signals to slow a rotation of its load. As a second example, synchrophasor operation may use frequency alignment and determinations when selecting when to actuate a relay and/or circuit breaker. Thus, synchrophasor operation may also improve from an improved frequency determination process.

Figure 4A:
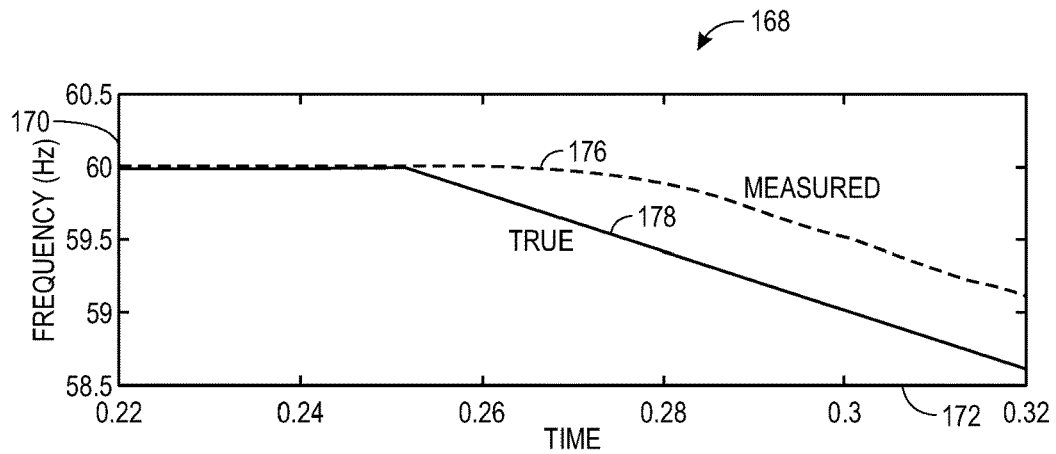
FIG. 4A is a graph of results of a first frequency measuring method, in accordance with an embodiment.
Figure 4B:
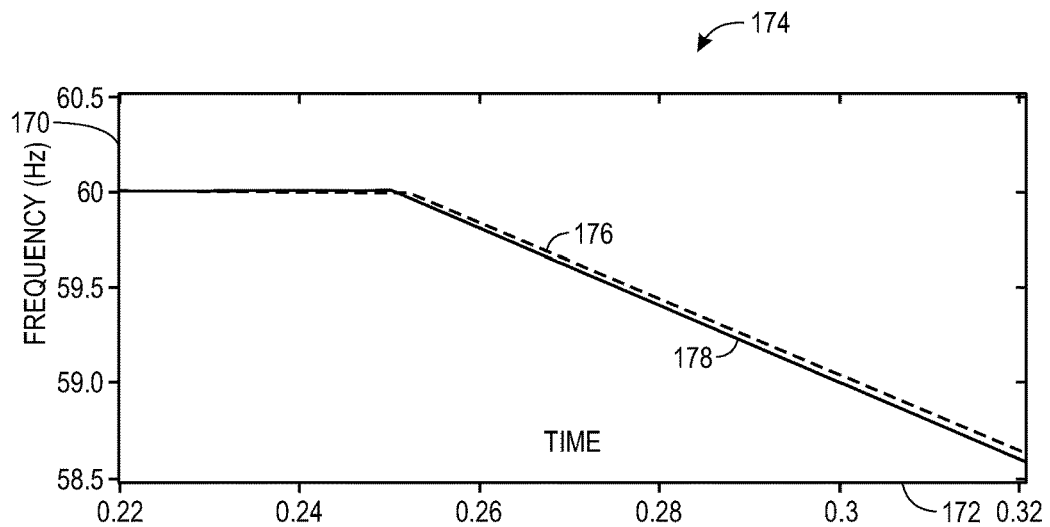
FIG. 4B is a graph of results of a second frequency measuring method, in accordance with an embodiment.

FIG. 4A is a graph 168 comparing an actual frequency of a simulated voltage waveform and a determined frequency of the simulated voltage waveform. FIG. 4B is a graph 174 comparing an actual frequency of the simulated voltage waveform and a determined frequency of the simulated voltage waveform, where the determined frequency is determined based at least in part on a derivative of the simulated voltage waveform. For ease of explanation, FIG. 4A and FIG. 4B are explained together. The graph 168 depicts a tracking of a first frequency determination method by comparing frequency (ordinate 170) to time (abscissa 172) while the graph 174 depicts a tracking of a second frequency determination method by comparing frequency (ordinate 170) to time (abscissa 172). The second frequency determination method is described further via FIG. 5 and improves on tracking of the measured frequency (e.g., line 176) to the actual frequency (e.g., line 178) shown via the graph 168. By improving the tracking of the measured frequency, the second frequency determination method may improve accuracy and response times of controllers that use the second frequency determination method to calculate frequency of a voltage or current signal during operation.

Figure 5:
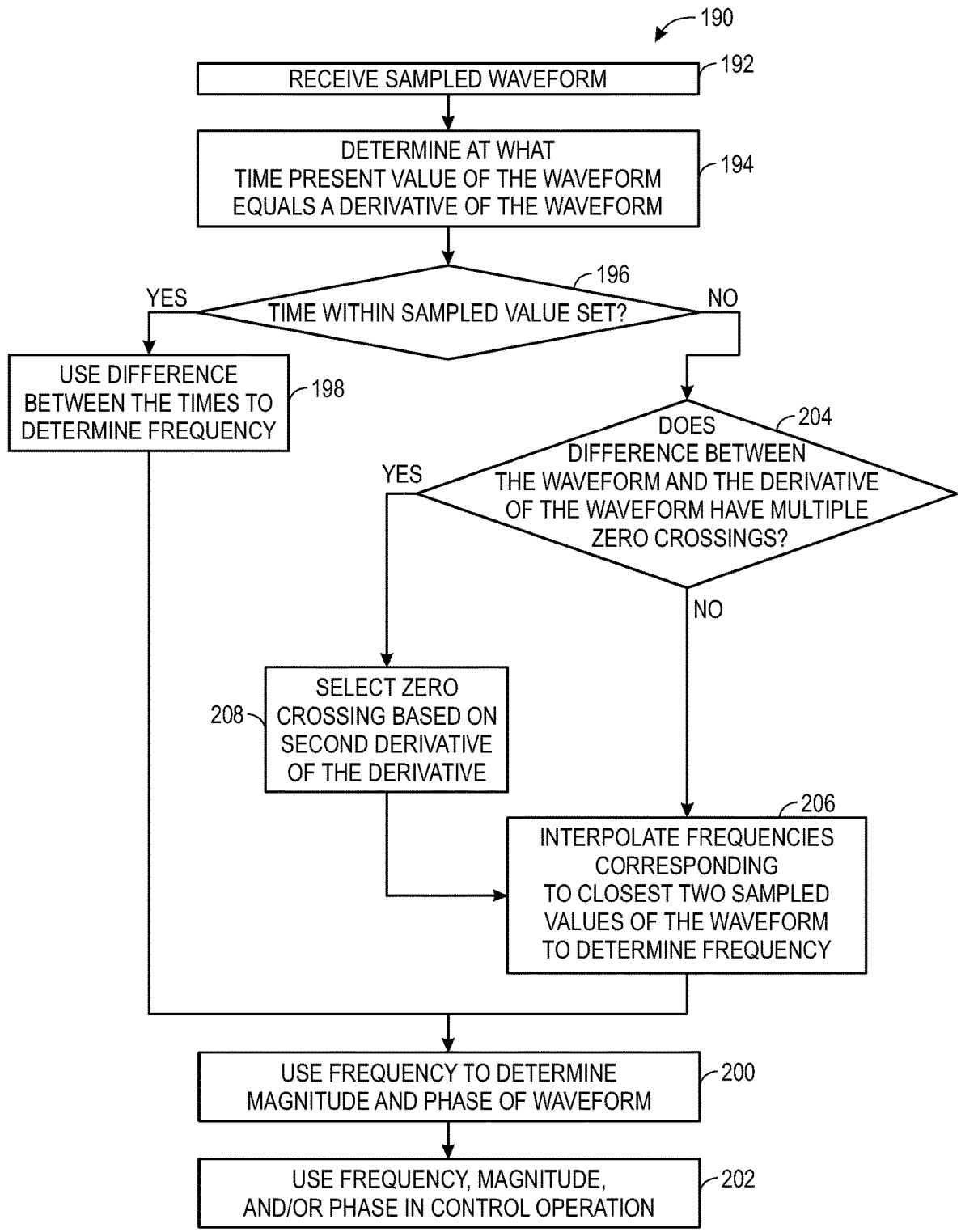
FIG. 5 is a flow diagram of a process for using the second frequency measuring method to determine the frequency of the voltage for use in the process of FIG. 3, in accordance with an embodiment.

Keeping this in mind, FIG. 5 is a flow diagram of a process 190 for using the second frequency measuring method to determine the frequency of the voltage for use in the process 150. The process 190 is described below as being performed by the processor 102, however, it should be understood that any suitable processor or processing circuitry may perform the process 190 to perform a frequency determination operation. Furthermore, although blocks 192-208 are depicted in a particular order, it should be understood that the processor 102 may perform fewer or additional operations in any suitable order when performing the process 190. Additionally, the process 190 is described below generically as based on recorded sensing data of a waveform of the power delivery system 20. It is noted that the below described method may be applied to current waveforms and/or voltage waveforms when determining a frequency of the power delivery system 20 and/or of the waveform.

At block 192, the processor 102 may receive a sampled waveform over time as sensed data values. The sampled waveform may be discretely-sensed voltage or current values recorded over time via sensing circuitry coupled to the processor 102. The processor 102 may store the sensed data values into the memory 104, such as a part of a historic sensing data record. The processor 102 may associate a time of sensing (e.g., time stamp) with the sensed data values in the memory 104.

At block 194, the processor 102 may search for a previous value of the derivative ($\dot{v}(t_x)$) at time $t_x$ for which Equation 1 is satisfied:

$$v(t_0) = \frac{\dot{v}(tx)}{2\pi \frac{1}{4(t_0 - t_x)}} \quad [1]$$

where $t_0$ is the time of the presently sensed value of the waveform and $v(t_0)$ is the value of the presently sensed waveform. The derivative may be found by any suitable method, such as by using historically recorded sensed voltage data or current data to determine the derivative of the waveform. The processor 102 may set the frequency (F) to:

$$F = \frac{1}{4(t_0 - t_x)} \quad [2]$$

Equivalently, the processor 102 may determine a scaled derivative ($\dot{V}(t)$) of the electrical waveform based on the computed derivative ($\dot{v}(t)$) and the time between the presently sensed value of the waveform and the time of the derivative sample, where the scaled derivative may be given as:

$$\dot{V}(t) = \frac{\dot{v}(t)}{2\pi \frac{1}{4(t_0 - t)}} \quad [3]$$

The processor 102 may determine the time $t_x$ corresponding to $\dot{V}(t_x)$ being equal to the presently sensed value of the electrical waveform. The processor 102 may determine the frequency based on the time of the presently sensed value of the waveform and the time $t_x$ as described in Equation 2.

Figure 6:
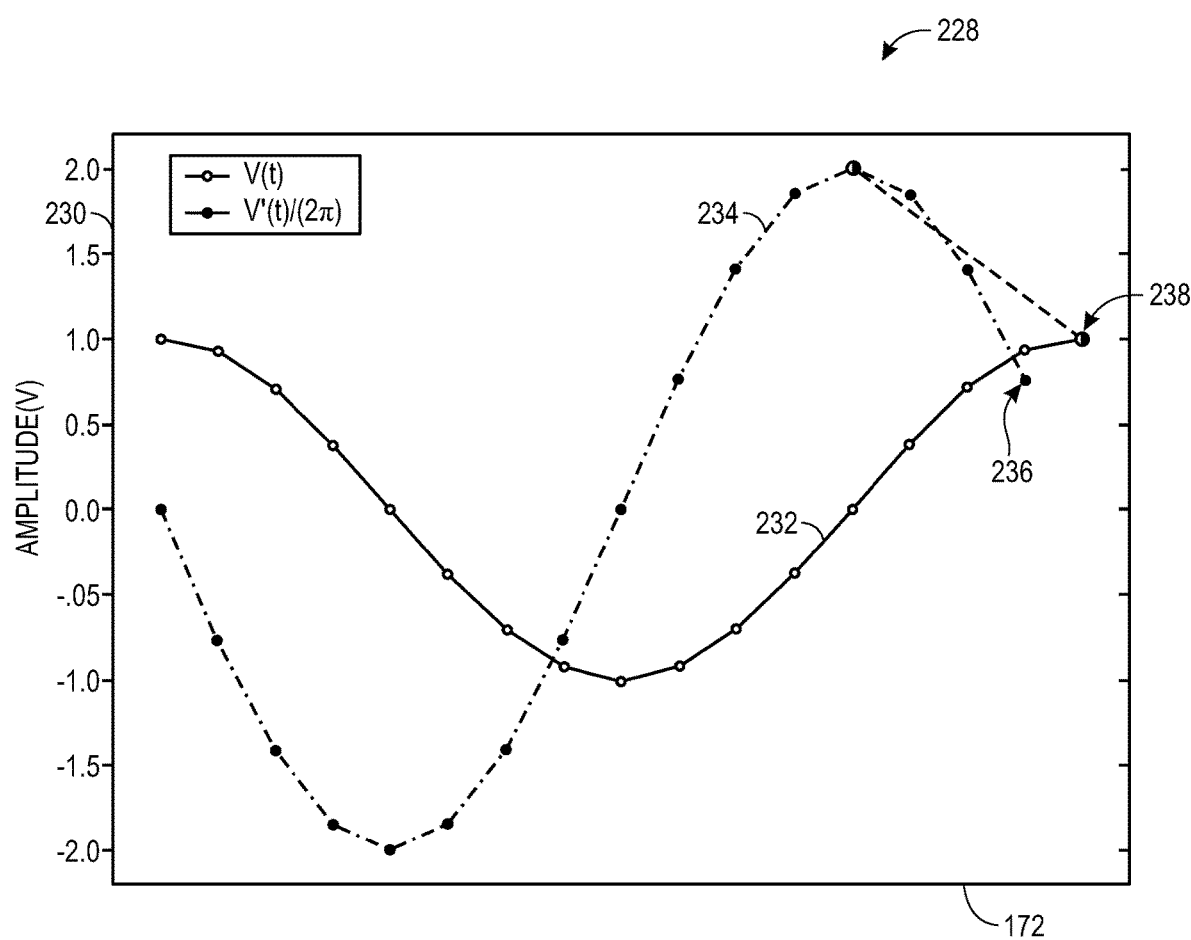
FIG. 6 is a graph of a first operation of the process of FIG. 5, in accordance with an embodiment.

To help illustrate, FIG. 6 is a graph 228 showing, generally, a comparison of the process 190. The graph 228 compares voltage amplitude (ordinate 230) over time (abscissa 172) of a voltage waveform (line 232) and of a derivative of the voltage waveform (line 234). It is noted that the derivative of the voltage waveform (line 234) is scaled by a factor equal to a for ease of plotting and may be scaled by an additional amount to permit a fair comparison between the voltage waveform and the derivative of the voltage waveform. When the processor 102 applies the relationship defined via Equation 1 to a sensed waveform, the processor 102 may compare a sensing value (v) sensed at the present time ($t_0$) to determined derivative values of the sensed waveform at various previous times that are scaled according to the time difference between the present time and the times of the particular derivative values to determine a frequency of the waveform before a period (e.g., frequency cycle) of the waveform completes. Graphically, when a prediction is correct, the prediction links the derivative of the voltage waveform (line 234) to the voltage waveform (line 234), as is shown with the value 238 but not the value 236. Using the derivative of the waveform to determine a frequency of the waveform may improve calculation speeds of frequency determinations. For example, an efficiency of determining a frequency of a voltage waveform may improve (e.g., be increased, calculation made faster) since the frequency is able to be determined in less than a full cycle of the voltage waveform.

Figure 7:
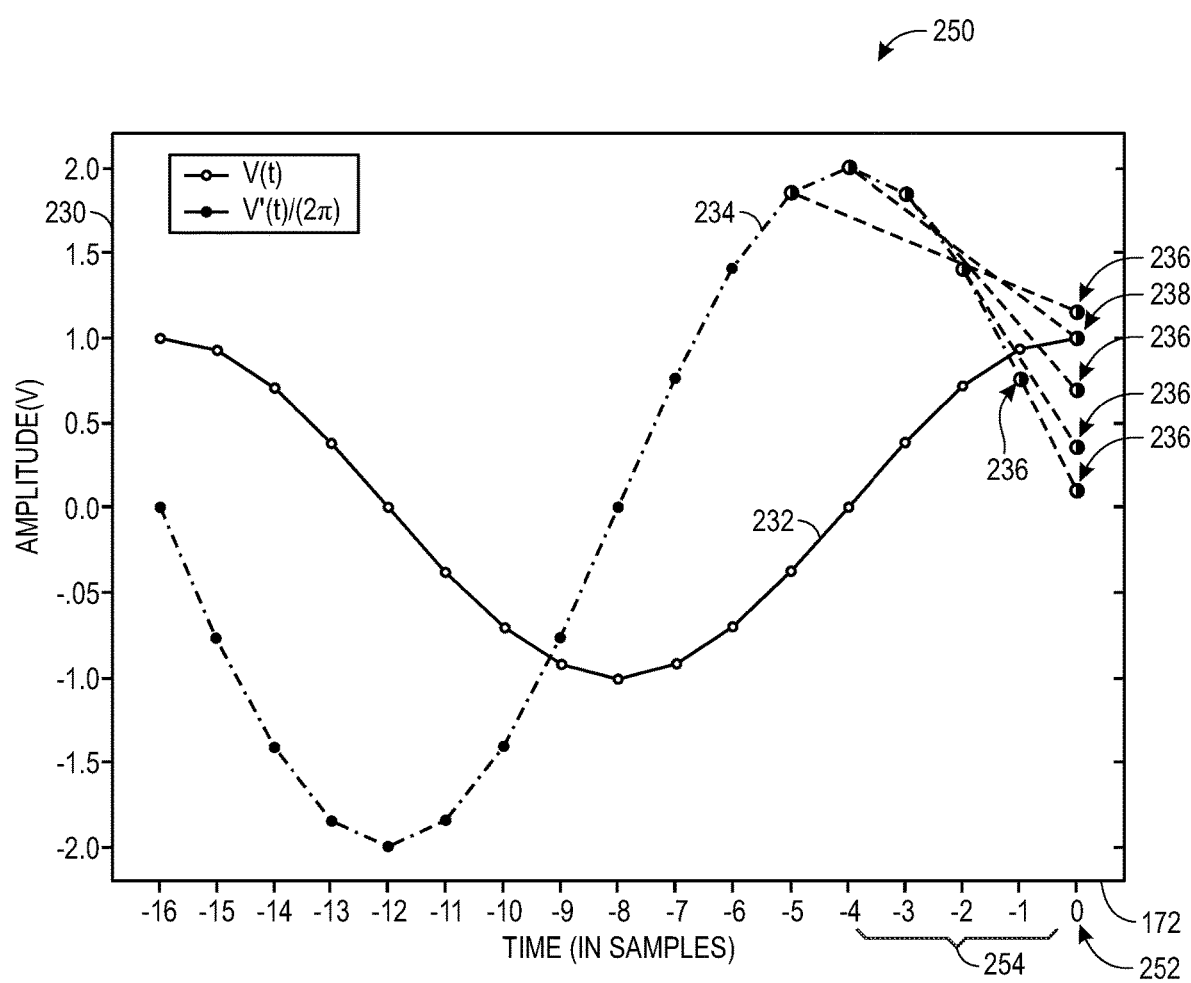
FIG. 7 is a graph of a second operation of the process of FIG. 5, in accordance with an embodiment.

To help illustrate, FIG. 7 is another graph 250 of the comparison operation. The graph 250 compares voltage amplitude (ordinate 230) over time (abscissa 172) of a voltage waveform (line 232) and of a derivative of the voltage waveform (line 234). It is noted that, similar to the graph 228, the derivative of the voltage (line 234) is scaled by a factor equal to a for ease of plotting. As described above, the processor 102 may apply Equation 1 and Equation 2 to determine the frequency. As depicted in the graph 250, the processor 102 may compare the voltage value sensed at the present time to and derivative values corresponding to previous sensed voltage values to determine which of the derivative values is to be used to determine the frequency of the voltage.

In this example, the frequency corresponding to value 238 is correct because the predicted voltage (e.g., calculated expected voltage, $v(t_0)$) equals the actual sensed voltage (e.g., falls on the same line). However, in this example, the frequencies corresponding to the value 236 may be incorrect because the predicted voltages do not equal the actual sensed voltage, nor are within a threshold of the actual sensed voltage. While using the process 190, the processor 102 may thus retain and use the frequency corresponding to the value 238 but discard and ignore the frequencies corresponding to the values 236.

Returning to FIG. 5, at block 196, the processor 102 may determine whether the time determined at block 194 $\left(\text{e.g., } t_{samp} = t_0 - \frac{1}{4F}\right)$ is a time represented within the set of sampled values that define the waveform. As discussed above, the waveform is sensed via many discrete sampling operations resulting in multiple sampling values. The multiple, discrete sampling values are used to numerically determine the derivative of the waveform. In this way, when it is determined that a previous sampled value corresponding to a scaled derivative of the waveform at a first time equals a presently sampled value sensed at a present time, the time determined is represented within the set of sampled values that define the waveform. However, when no discretely-obtained derivative value corresponds to the presently sampled value (e.g., the presently sampled value equals a voltage between two discrete derivative values scaled by a scaling factor of Equation 1), the time determined is represented outside of the set of sampled values that define the waveform.

Figure 8:
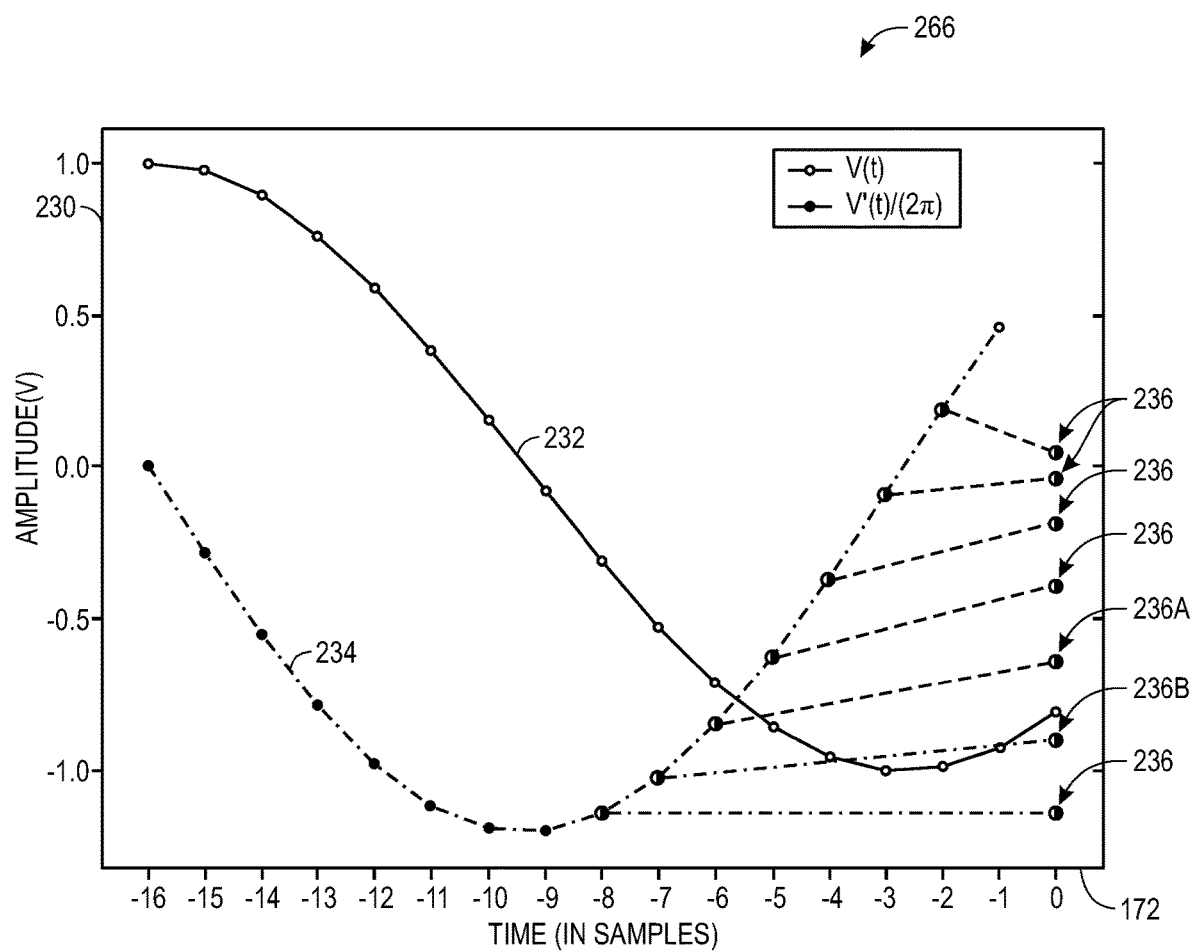
FIG. 8 is a graph of a third operation of the process of FIG. 5, in accordance with an embodiment.

To help illustrate, FIG. 8 is a graph 266 depicting a situation in which the time determined at block 194 may not be represented within the set of sampled values that define the waveform. The graph 266 compares voltage amplitude (ordinate 230) over time (abscissa 172) of a voltage waveform (line 232) and of a derivative of the voltage waveform (line 234). It is noted that, similar to the graph 228, the derivative of the voltage waveform (line 234) is scaled by a factor equal to a for ease of plotting. The graph 266 highlights how in some cases, the processor 102 may determine that none of the frequency predictions yield a suitable calculated expected voltage. In particular, the values 236, corresponding to a time shifted derivative of the waveform and scaled by the scaling factor, show that the present sensed value is not represented within the set of sampled values that define the waveform.

Returning to FIG. 5, when the time determined at block 194 is represented within the set of sampled values that define the waveform, the processor 102, at block 198, may use the difference between the time determined at block 194 to determine the frequency (e.g., by applying the relationship defined in Equation 1). However, when the time determined at block 194 is determined to be between times of the set of sampled values, the processor 102 performs an alternative method for determining the frequency (e.g., operations of blocks 204-210).

Thus, at block 204, the processor 102 may determine whether a difference between the waveform and the derivative of the waveform (or the scaled derivative of the waveform) has multiple zero crossings. The processor 102 may subtract the derivative of the waveform from the waveform. The processor 102 may then determine where the difference changes sign (e.g., a zero crossing) and may use sampled values corresponding to the zero crossings to determine the frequency. For example, the processor 102 may determine flanking sampled values to the zero crossing (e.g., when the zero crossing is at a N sample number between a sample set of A, B, N, C, D, the flanking sampled values are B and C) and interpolate the flanking sampled values to identify the frequency corresponding to the time of zero crossing (e.g., perform an interpolation operation). That is, the processor 102 may determine a time $t_x$ in which the value of the scaled derivative is substantially equal to the presently sampled value of the waveform by interpolating the difference between values of the scaled derivative and the waveform.

When the determined difference between the waveform and the scaled derivative of the waveform does not include multiple zero crossings, the processor 102 may, at block 206, interpolate frequencies corresponding to two nearby sampled values of the waveform to determine the frequency.

Figure 9:
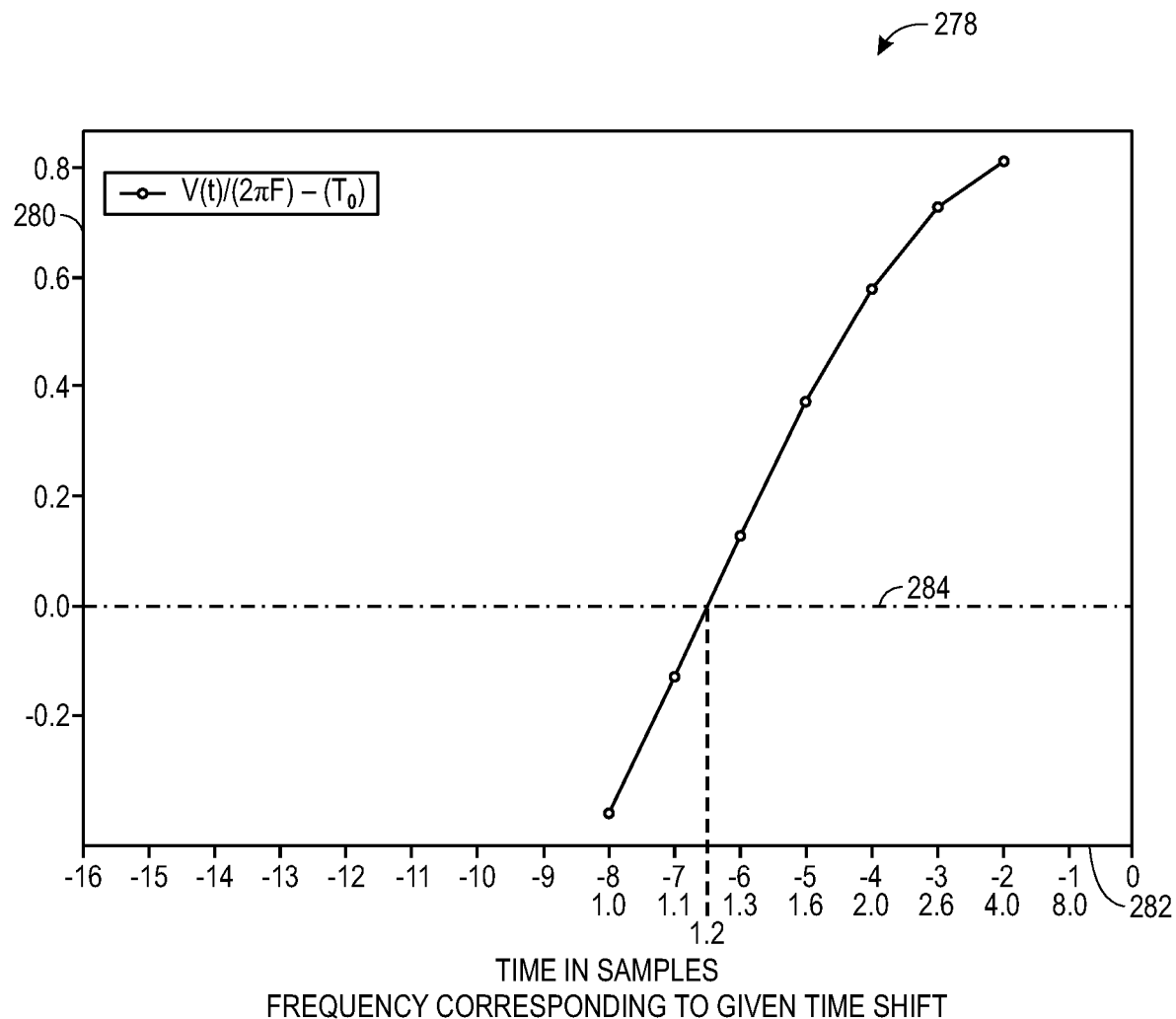
FIG. 9 is a graph of a fourth operation of the process of FIG. 5, in accordance with an embodiment.

To help illustrate, FIG. 9 is a graph 278 showing the difference between each of the values 236 of the scaled derivative and the presently sampled value of the signal (line 232) of the waveform applied to the simulated voltages of the graph 266 of FIG. 8. The graph 278 compares difference amplitude (ordinate 280) over time (abscissa 282) in samples from an initial time (e.g., t=0) of a voltage (line 232) and of a derivative of the voltage (line 234).

It is also noted that the resulting frequency predictions corresponding to each time are shown adjacent to the time axis for samples between t=0 and t=−7. In this example, the processor 102 may determine that the difference changes sign between the t=−6 samples and t=−7 samples, where frequency of the waveform at t=−6 samples corresponds to 1.3 Hz and the t=−7 samples corresponds to 1.1 Hz. This change happens at a zero axis 284. Thus, to determine the frequency, the processor 102 may interpolate the predicted frequencies for the t=−6 and t=−7 samples to determine that the voltage has a frequency equal to 1.2 Hz.

The processor 102 may determine a first distance between the scaled derivative (e.g., second value 236A) at a third time (e.g., t=−6) and the first value (e.g., presently sampled value of the signal (line 232)). The process may continue by determining a second distance between the scaled derivative (e.g., second value 236B) at a fourth time (e.g., t=−7) and the first value (e.g., presently sampled value). The processor 102 may then interpolate between the first distance and the second distance to obtain the zero crossing time ($t_x$) (e.g., a second time between times t=−6 and t=−7) at which the scaled derivative substantially equals (according to interpolation) the first value (e.g., presently sampled value of the signal (line 232)). The processor 102 may determine the frequency as the time duration between the presently sampled time ($t_0$) and the zero crossing time by using Equation 2. While the interpolation is described herein as between two values (e.g., linearly), any suitable interpolation or extrapolation may be used.

Returning to FIG. 5, in response to determining that the determined difference between the waveform and the scaled derivative of the waveform includes multiple zero crossings, the processor 102, at block 208, selects the zero crossing based on the derivative of the determined difference between the waveform and the derivative of the waveform. In this way, the processor 102 may analyze rates of change (e.g., slopes) associated with discretely sampled values of the waveform (and the various derivatives and differences of the waveform) to determine which zero crossing may be used to determine the frequency. For example, when the most recently determined derivative of the difference (e.g., the difference between the waveform and the scaled derivative of the waveform) is positive, the processor 102 may choose the zero crossing corresponding to a positive rate of change (e.g., positive slope, a relatively largest positive rate of change). However, when the most recently determined derivative of the difference (e.g., the difference between the waveform and the scaled derivative of the waveform) is negative, the processor 102 may choose the zero crossing corresponding to a negative rate of change (e.g., negative slope, relatively largest negative rate of change).

Figure 10A:
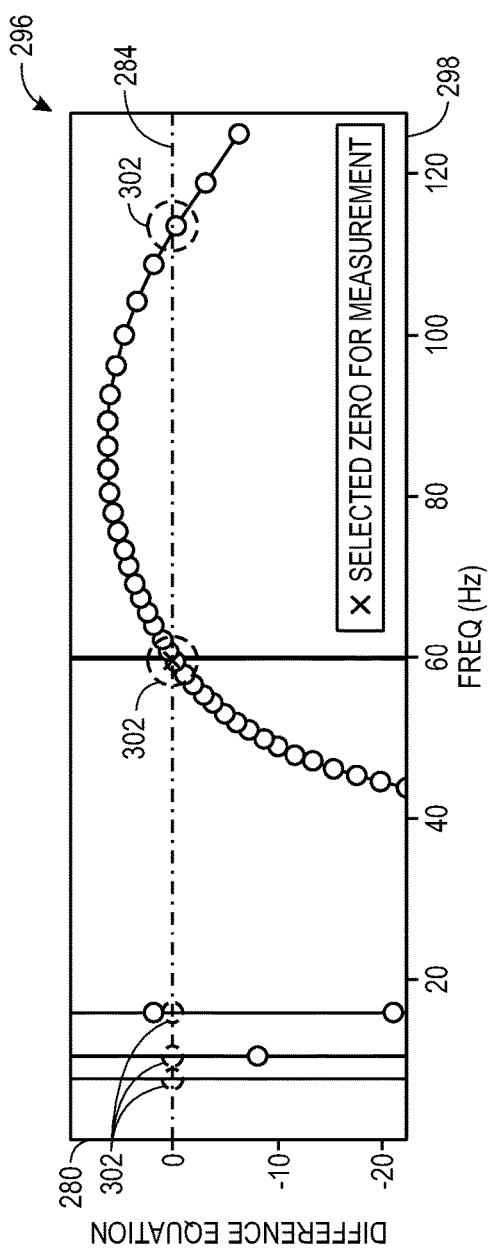
FIG. 10A is a graph of an example operation performed via the process of FIG. 5, in accordance with an embodiment.
Figure 10B:
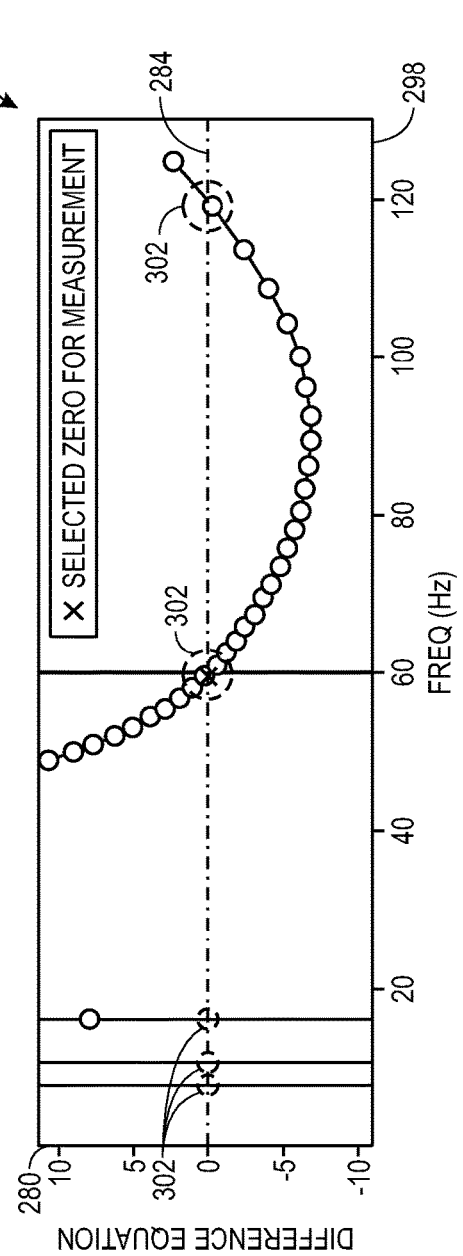
FIG. 10B is a graph of another example operation performed via the process of FIG. 5, in accordance with an embodiment.

To help illustrate, FIG. 10A is a graph 296 depicting a simulated waveform that has multiple zero crossings of the zero axis 284. FIG. 10B is a graph 300 depicting a simulated waveform that has multiple zero crossings of the zero axis 284. For ease of description, FIG. 10A and FIG. 10B are explained together herein. The graph 296 compares difference amplitude (ordinate 280) over frequency (abscissa 298). The graph 300 also compares difference amplitudes (ordinate 280) over frequency (abscissa 298).

Consider first the graph 296. The graph 296 has zeros 302 at about 7 Hz, 11 Hz, 16 Hz, 60 Hz, and 112 Hz (e.g., where the difference changes sign). The processor 102 may determine which of the zeros 302 correspond to a positive slope and that there are more than two zeros 302. The selected zero of the graph 296 that is to correspond to the determined frequency may be 60 Hz. Furthermore, when considering the graph 300, the graph 300 has zeros 302 at about 8 Hz, 10 Hz, 16 Hz, 60 Hz, and 120 Hz. In this case, the processor 102 may select the zero 302 corresponding to the zero 302 having a negative slope. The selected zero 302 in this example also equals 60 Hz.

Returning to FIG. 5, once the zero crossing is selected, the processor 102, may use the selected zero crossing in operations of block 206 to determine the frequency of the waveform. For example, the processor 102 may interpolate frequencies corresponding to nearby sampled values to determine the frequency of the waveform.

At block 210, the processor 102 may use the frequency determined at block 198 or block 206 to determine a magnitude and/or phase of the waveform at the present time of sensing. The magnitude and/or phase of the waveform may be used to represent the waveform in a certain domain, such as a phasor domain. Any suitable method may be used to determine a magnitude and/or phase of the waveform.

At block 212, the processor 102 may use the frequency, magnitude, and/or phase in a control operation to adjust one or more operations of the power delivery system 20. For example, the processor 102 may operate to cause transmission of a control signal to operate a circuit breaker (e.g., the circuit breaker 44, the circuit breaker 54) to close or operate another protective device. A variety of control operations may benefit from a frequency determination with improved efficiency. As another example, the processor 102 may use the frequency determination when performing synchrophasing operations (e.g., determining when a load side of an IED has a same frequency and/or phase as a line side of the IED).

In some cases, a magnitude of the waveform may change during a data window. When this happens, a ratio between magnitudes may be used to determine the frequency of the waveform at a present time. The data window may refer to a number of data samples used for a calculation of a particular quantity. In this case, the data window thus may be the number of data samples used to determine the frequency, or for example, a data window corresponding to the one-fourth cycle time interval (e.g., $t_0 - 1/(4F)$).

For example, using a voltage waveform for the following example, both Equation 4 and Equation 5 use the derivative of the voltage at the present time, $\dot{v}(t_0)$, the determined frequency, F, and a voltage at the first time $v(t_0)$ to determine the magnitude and phase of the voltage waveform. At the time determined at block 198, the magnitude may be determined using the Equation 6.

$$m_{F\text{exact}} = \sqrt{\left(\frac{\dot{v}(t_0)}{2\pi F}\right)^2 + (v(t_0))^2} \quad [4]$$

$$\text{phase} = \text{atan2}\left(\frac{\dot{v}(t_0)}{2\pi F}, v(t_0)\right) \quad [5]$$

$$m_F = \sqrt{\left(\frac{\dot{v}\left(t_0 - \frac{1}{4F}\right)}{2\pi F}\right)^2 + \left(v\left(t_0 - \frac{1}{4F}\right)\right)^2} \quad [6]$$

The relationships of Equation 4 and Equation 6 may be used to determine the frequency of the waveform. For example, Equation 8 uses the derivative of the voltage at the determined at block $$198 \left(\dot{v}\left(t_0 - \frac{1}{4F}\right)\right),$$

a presently sensed value ($\dot{v}(t_0)$), the determined frequency (F), a voltage at the first time ($v(t_0)$), and a change in voltage magnitude $$\left(\frac{m_{0F}}{m_F}\right)$$

to determine the frequency. After the frequency is determined using Equation 7, the magnitude and phase may be determined using Equation 4 and Equation 5.

$$0 = \frac{m_{0F}}{m_F} \frac{\dot{v}\left(t_0 - \frac{1}{4F}\right)}{2\pi F} - v(t_0) \quad [7]$$

In some cases, the processor 102 may improve an accuracy of its frequency determination operations by at least in part applying the Equation 7 at local maximums. For example, the processor 102 may apply the Equation 7 when the absolute value of the voltage and the absolute value of the derivative of the voltage are both away from a zero (or a threshold amount away from a zero). In some cases, this is satisfied around 45 degrees (°), 135°, −135°, and −45° of the waveform, where the degrees correspond to relatively defined points of a sinusoidal cycle for the waveform.

In another example, the processor 102 may additionally or alternatively recover a value of the waveform at a present time by integrating of the derivative of the waveform from a time corresponding to a local maximum until the present time. The accuracy of the operations of the processor 102 may improve if the processor 102 begins its integration of the derivative of the voltage at a zero crossing of the derivative of the voltage, rather than a local maximum or minimum.

Figure 11:
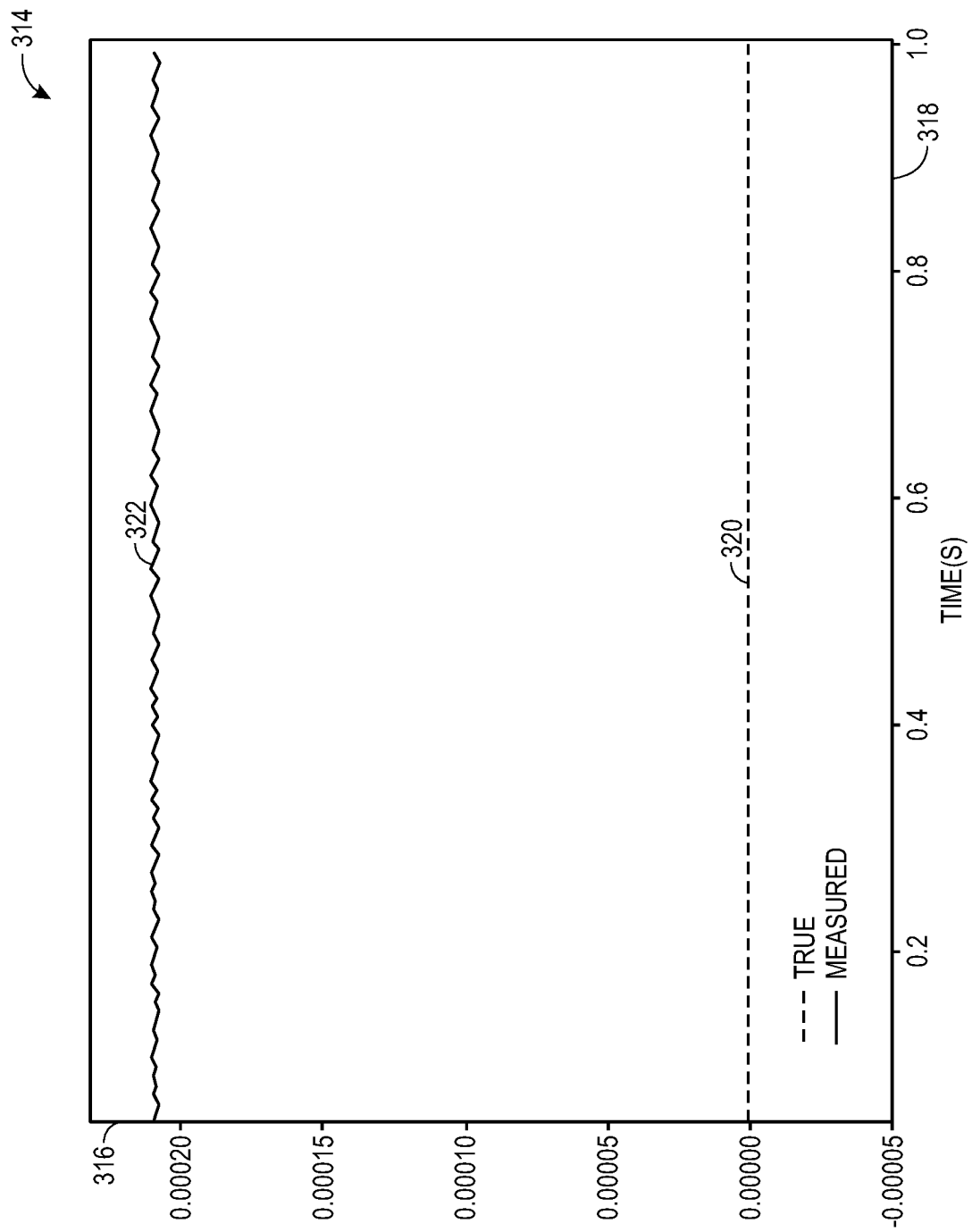
FIG. 11 is a graph of the determined frequency of a simulated voltage waveform determined via the process of FIG. 5, in accordance with an embodiment.

By using the system and methods described above, accuracy and general performance of the frequency determination operations may improve. For example, FIG. 11 is a graph 314 of the determined frequency of a simulated voltage waveform determined via the process 190 of FIG. 5. The graph 314 compares error magnitude (ordinate 316) over time in seconds (abscissa 318) for both a true frequency determination 320 (e.g., error=0) and for a measured frequency determination 322 (e.g., non-zero error). In this example, a 61.5 Hz voltage was simulated for measurement. It is noted that the steady state performance of the described systems and methods when applied to this example may be higher than 0.3 millihertz (mHz).

Figure 12:
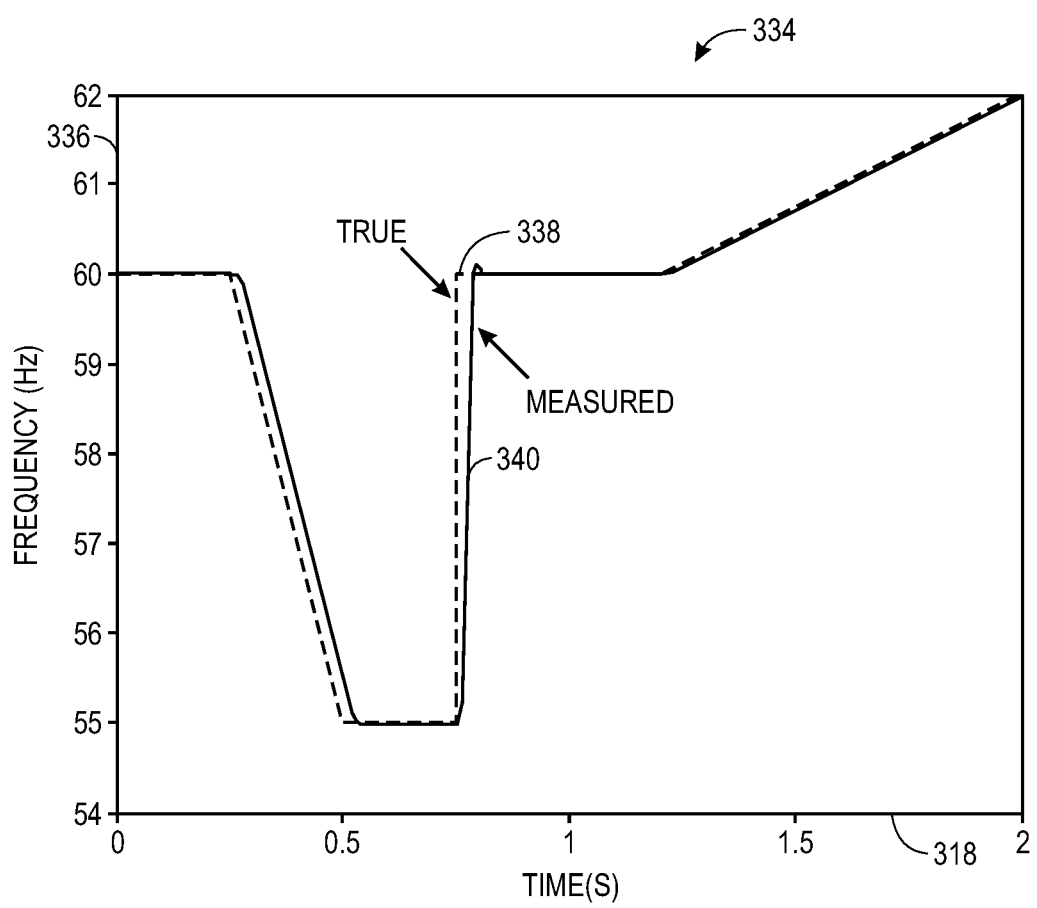
FIG. 12 is a graph of an accuracy of the frequency of the voltage determined via the process of FIG. 5, in accordance with an embodiment.

As an additional example, FIG. 12 is a graph 334 of an accuracy of the frequency of the voltage determined via the process 190 of FIG. 5. The graph 334 compares frequency in Hz (ordinate 336) over time in seconds (abscissa 318) for both a true frequency determination 338 (e.g., error=0) and for a measured frequency determination 340 (e.g., non-zero error). FIG. 12 highlights how the simulated performance of the systems and methods described herein may yield relatively reliable frequency determinations.

Thus, technical effects of the present disclosure include systems and methods for determining a frequency of a voltage and/or of a current of a power delivery system based at least in part on derivative calculations. By using the methods described above, a frequency determination system (e.g., frequency determination subsystem including a processor and a memory of a controller) may obtain measurements within a quarter-cycle of the measured signals and with relatively low processing burdens. Furthermore, these methods may permit the frequency determination system to obtain a frequency measurement for a relatively broad range of frequencies (e.g., 1 Hz to 120 Hz). These improved methods may improve power delivery system operation by enabling control and/or protection circuitry to operate in a more efficient manner (e.g., when the baseline frequency measurement is improved and/or more efficient). This may improve a response of the power delivery system to a fault condition, or otherwise detected abnormal operation.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may or may not include long-distance transmission of high-voltage power. Accordingly, many changes may be made to the details of the above-described embodiments without departing from the underlying principles of this disclosure. The scope of the present disclosure should, therefore, be determined only by the following claims.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. A system comprising:
a memory device; and
a processor operatively coupled to the memory device, wherein the processor is configured to execute instructions stored on the memory device to cause operations comprising:
obtaining a plurality of electrical values of an electrical waveform of an electric power delivery system, wherein the plurality of electrical values comprises:
a first value obtained at a first time; and
a plurality of previous values obtained at a plurality of times before the first time, wherein the plurality of previous values comprises a first previous value obtained at a second time;
determining a plurality of computed derivative values of the electrical waveform based on one or more of the plurality of previous values, wherein the plurality of computed derivative values comprises a first computed derivative value corresponding to a derivative of the first previous value;
determining, from the first computed derivative value, a first scaled derivative value that is scaled according to a first time duration between the second time and the first time;
determining a frequency of the electrical waveform based at least in part on the first time duration, the first value, and the first scaled derivative value; and
causing an operation of the electric power delivery system to be controlled based at least in part on the frequency.

2. The system of claim 1, wherein the processor is configured to cause operations comprising determining that the first scaled derivative is substantially equal to the first value of the electrical waveform.

3. The system of claim 1, wherein the processor is configured to cause operations comprising:
determining a plurality of scaled derivative values comprising at least the first scaled derivative value; and
searching, within the plurality of scaled derivative values, to find the first scaled derivative value that matches the first value of the plurality of electrical values such that:

$$v(t_0) = \frac{\dot{v}(t_x)}{2\pi \frac{1}{4(t_0 - t_x)}}$$

where $t_0$ is the first time, $t_x$ is the second time, $v(t_0)$ is the first value, $\dot{v}(t_x)$ is the first computed derivative value, and the first time duration is the difference between $t_0$ and $t_x$.

4. The system of claim 1, wherein the processor is configured to cause operations comprising determining the frequency as:

$$F = \frac{1}{4(t_0 - t_x)}$$

where $t_x$ is the second time and $t_0$ is the first time.

5. The system of claim 1, wherein the processor is configured to cause operations comprising determining changes in magnitude between each of the plurality of previous values to determine the plurality of computed derivative values.

6. The system of claim 1, wherein the processor is configured to cause operations comprising:
determining, from a second computed derivative value in the plurality of computed derivative values, a second scaled directive value that is scaled according to a third time duration between a time at which the second computed derivative value had occurred and the first time; and
determining the frequency based on interpolating between the first scaled derivative value and the second scaled derivative value.

7. The system of claim 1, wherein the processor is configured to cause operations comprising calculating the first scaled derivative of the electrical waveform when the first value at the first time is a local maximum.

8. A method, comprising:
obtaining, via an intelligent electronic device (IED), a plurality of electrical values of an electrical waveform of an electric power delivery system, wherein the plurality of electrical values comprises:
   a first value sensed by sensing circuitry of the TED at a first time; and
   a plurality of previous values at times before the first time, wherein the plurality of previous values comprises a first previous value obtained at a second time;
determining a plurality of computed derivative values of the electrical waveform based on one or more of the plurality of previous values, wherein the plurality of computed derivative values comprises a first computed derivative value corresponding to a derivative of the first previous value;
determining, from the first computed derivative value, a first scaled derivative value that is scaled according to a first time duration between the second time and the first time;
determining a frequency of the electrical waveform based at least in part on the first time duration, the first value, and the first scaled derivative value; and
causing, via the TED, an operation of the electric power delivery system to be controlled based at least in part on the frequency.

9. The method of claim 8, comprising:
determining a plurality of scaled derivative values comprising at least the first scaled derivative value; and
searching, within the plurality of scaled derivative values, to find the first scaled derivative value that matches the first value of the plurality of electrical values such that:

$$v(t_0) = \frac{\dot{v}(t_x)}{2\pi \frac{1}{4(t_0 - t_x)}}$$

where $t_0$ is the first time, $t_x$ is the second time, $v(t_0)$ is the first value, $\dot{v}(t_x)$ is the first computed derivative value, and the first time duration is the difference between $t_0$ and $t_x$.

10. The method of claim 8, comprising determining the frequency as:

$$F = \frac{1}{4(t_0 - t_x)}$$

where $t_x$ is the second time and $t_0$ is the first time.

11. The method of claim 8, comprising determining changes in magnitude between each of the plurality of previous values to determine the plurality of computed derivative values.

12. The method of claim 8, comprising determining that the first scaled derivative value is substantially equal to the first value.

13. The method of claim 8, comprising transmitting the frequency thereby adjusting operation of a component of the electric power delivery system based at least in part on the frequency.

14. A tangible, non-transitory, computer-readable medium comprising instructions that, when executed by a processor, cause the processor to:
obtain, via an intelligent electronic device (IED), a plurality of electrical values of an electrical waveform of an electric power delivery system, wherein the plurality of electrical values comprises:
   a first value obtained at a first time; and
   a plurality of previous values obtained at a plurality of times before the first time, wherein the plurality of previous values comprises a first previous value obtained at a second time;
determine a plurality of computed derivative values of the electrical waveform based on one or more of the plurality of previous values, wherein the plurality of computed derivative values comprises a first computed derivative value corresponding to a derivative of the first previous value;
determine, from the first computed derivative value, a first scaled derivative value that is scaled according to a first time duration between the second time the first time;
determine a frequency of the electrical waveform based at least in part on the first time duration, the first value, and the first scaled derivative value; and
cause, via the TED, an operation of the electric power delivery system to be controlled based at least in part on the frequency.

15. The tangible, non-transitory, computer-readable medium of claim 14, comprising instructions that cause the processor to transmit the frequency thereby adjusting operation of a component of the electric power delivery system based at least in part on the frequency.

16. The tangible, non-transitory, computer-readable medium of claim 14, comprising instructions that cause the processor to select a zero crossing time associated with a positive slope of a difference between the electrical waveform and the first scaled derivative of the electrical waveform when a present derivative of the electrical waveform is positive.

17. The tangible, non-transitory, computer-readable medium of claim 14, comprising instructions that cause the processor to search for the first scaled derivative value from of a plurality of scaled derivatives scaled derivative to satisfy:

$$v(t_0) = \frac{\dot{v}(t_x)}{2\pi \frac{1}{4(t_0 - t_x)}}$$

where $t_0$ is the first time, $t_x$ is the second time, $v(t_0)$ is the first value, $\dot{v}(t_x)$ is the first computed derivative value, and the time duration is the difference between $t_0$ and $t_x$.

18. The tangible, non-transitory, computer-readable medium of claim 14, comprising instructions that cause the processor to determine the frequency as:

$$F = \frac{1}{4(t_0 - t_x)}$$

where $t_x$ is the second time and $t_0$ is the first time.

19. The tangible, non-transitory, computer-readable medium of claim 14, comprising instructions that cause the processor to, upon determining that the first scaled derivative is substantially equal to the first value of the electrical waveform, determine the frequency of the electrical waveform based at least in part on the first time duration between the second time and the first time.

20. The tangible, non-transitory, computer-readable medium of claim 14, comprising instructions that cause the processor to:
   determine, from a second computed derivative value in the plurality of computed derivative values, a second scaled directive value that is scaled according to a third time duration between a time at which the second computed derivative value had occurred and the first time; and
   determining the frequency based on interpolating between the first scaled derivative value and the second scaled derivative value.

* * * * *